(12) United States Patent
Weston et al.

(10) Patent No.: US 7,125,796 B2
(45) Date of Patent: Oct. 24, 2006

(54) PLASMA ETCH PROCESS FOR MULTILAYER VIAS HAVING AN ORGANIC LAYER WITH VERTICAL SIDEWALLS

(75) Inventors: Donald F. Weston, Phoenix, AZ (US); William J. Dauksher, Mesa, AZ (US); Ngoc V. Le, Gilbert, AZ (US)

(73) Assignee: Motorola, Inc., Schaumburg, IL (US)

( * ) Notice: Subject to any disclaimer, the term of this patent is extended or adjusted under 35 U.S.C. 154(b) by 55 days.

(21) Appl. No.: 11/000,832

(22) Filed: Nov. 30, 2004

(65) Prior Publication Data

US 2006/0115979 A1    Jun. 1, 2006

(51) Int. Cl.
*H01L 21/4763* (2006.01)
*H01L 21/461* (2006.01)

(52) U.S. Cl. .............. 438/637; 257/E21.218; 257/E21.577; 257/E21.313; 257/E21.6; 257/E21.024

(58) Field of Classification Search ............. 438/637
See application file for complete search history.

(56) References Cited

U.S. PATENT DOCUMENTS

| | | | |
|---|---|---|---|
| 5,719,089 A * | 2/1998 | Cherng et al. ............. 438/637 |
| 6,174,800 B1 * | 1/2001 | Jang ............................ 438/629 |
| 6,261,947 B1 * | 7/2001 | McTeer ....................... 438/637 |
| 6,291,887 B1 * | 9/2001 | Wang et al. ................. 257/758 |
| 6,348,407 B1 * | 2/2002 | Gupta et al. ................. 438/637 |
| 6,372,631 B1 * | 4/2002 | Wang et al. ................. 438/624 |
| 6,759,263 B1 * | 7/2004 | Ying et al. .................... 438/48 |
| 2005/0255697 A1 * | 11/2005 | Nguyen et al. ............. 438/638 |

OTHER PUBLICATIONS

Kuchenmeister et al., "A Comparative CMP Study of BCB and SiLK for Copper Damascene Technologies," Advanced Metallization Conference Proceedings 1998, pp. 237.242.

Schier, Michael, "Reactive Ion Etching of Benzocyclobutene Using a Silicon Nitride Dielectric Etch Mask," J. Electrochemical Society, vol. 142, No. 9, Sep. 1995, pp. 3238-3240.

* cited by examiner

*Primary Examiner*—Walter Lindsay, Jr.
*Assistant Examiner*—Thu-Huong Dinh

(57) ABSTRACT

A process is provided for fabricating a via 52 between bonded wafers without undercutting an organic bonding material 32. The process for forming the via 52 in a structure including a dielectric material 14 and an organic bonding material 32, comprises forming a resist material 42 on the dielectric layer 14 and etching through the dielectric layer 14 and the organic bonding material 32 with $60CF_4/20Ar/60CHF_3/20N_2$. The resist may then be removed with an anisotropic high density oxygen plasma.

20 Claims, 3 Drawing Sheets

PLASMA ETCH PROCESS FOR MULTILAYER VIAS HAVING AN ORGANIC LAYER WITH VERTICAL SIDEWALLS

FIELD OF THE INVENTION

The present invention generally relates to a semiconductor process and more particularly to a semiconductor process for etching an organic layer to produce a via having vertical sidewalls.

BACKGROUND OF THE INVENTION

Integrated circuits are formed with a multiple layering process involving a number of materials including semiconductors, conductors, and dielectrics. Transistors, capacitors, diodes and the like are formed within these layers and are interconnected to one another in a variety of ways known to those skilled in the art. A via, or vertical metal connector, may be used to connect these devices between layers, or to connect a device with an external pad.

There are many known methods of making a via in the fabrication of an integrated circuit. Using known pattern and etch techniques, a vertical opening is created in the materials and a metal, such as copper, is formed therein. Known processes of forming a via in inorganic materials are capable of providing high quality vias. However, many applications, such as optics, today utilize organic materials. One example is the use of an organic adhesive wafer bond when bonding a donor wafer to a host wafer. Known processes that etch the dielectric layers are destructive to the adjoining organic adhesive layer. Further, conventional wet etching to remove a photoresist used in the masking process can also be destructive to the organic layer.

Accordingly, it is desirable to provide a process for etching a dielectric layer overlying an organic layer without undercutting the organic layer. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A process is provided for fabricating a via between bonded wafers without undercutting an organic bonding material. The process for forming the via in a structure including a dielectric and an organic bonding material, comprises forming a resist material on the dielectric layer and etching through the dielectric layer and the organic bonding material with an etch comprising $CF_4$, Ar, $CHF_3$, and N, in a first embodiment, and $60CF_4/20Ar/60CHF_3/20N_2$ in a more specific embodiment. The resist may then be removed with an anisotropic high density oxygen plasma.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
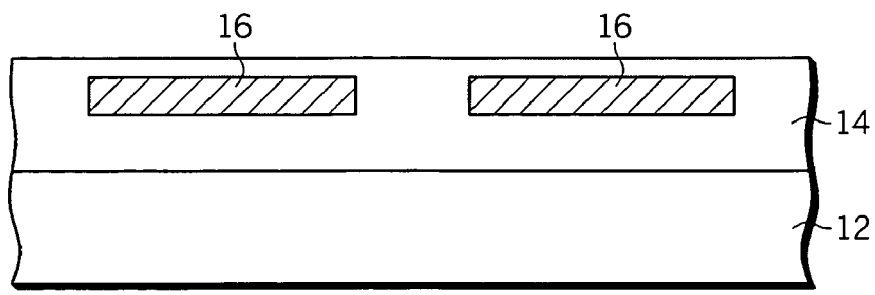
FIG. 1 is a cross section of a donor wafer.

Referring to FIG. 1, a cross section of a donor wafer 10 includes a dielectric layer 14 overlying a substrate 12. The substrate 12 may comprise, for example, a silicon material and the dielectric layer 14 may comprise silicon dioxide, silicon nitride, etc., and include a number of integrated circuit elements (not shown), such as transistors, diodes, and the like. For optical applications, the donor wafer 10 could be an active layer comprising photodiodes and the like. The dielectric layer 14 preferably would have a thickness of approximately 3 microns for this embodiment, but would vary as a function of the particular application. Metal connector 16, made of copper for example, is fabricated within the dielectric layer 14 in a manner known to those skilled in the art. Alignment keys may be formed in the silicon layer to mate to the corresponding keys on the host wafer.

Figure 2:
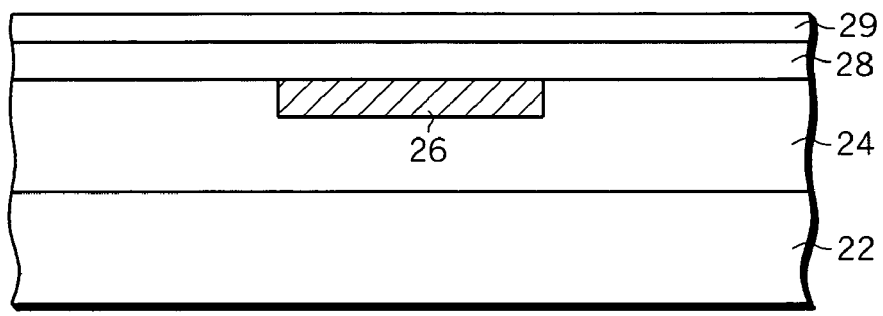
FIG. 2 is a cross section of a host wafer.

Referring to FIG. 2, a cross section of a host wafer 20 includes a dielectric layer 24 overlying a substrate 22. The substrate 22 and dielectric layer 24 may comprise, for example, a silicon material and a silicon dioxide material, respectively, and include a number of integrated circuit elements (not shown), such as transistors, diodes, and the like. Metal connector 26, made of copper for example, is fabricated within the dielectric layer 24 in a manner known to those skilled in the art. A silicon nitride layer 28, approximately 500 Angstroms thick, is formed on the dielectric layer 24 and metal connector 26. The silicon nitride layer 28 is used as an etch stop for the chemical mechanical polishing of the host wafer 20. A silicon oxide layer 29, about 500 Angstroms thick is formed on the silicon nitride layer 28. The silicon oxide layer 29 is used as an adhesion layer during the bonding of the host and donor wafers.

Figure 3:
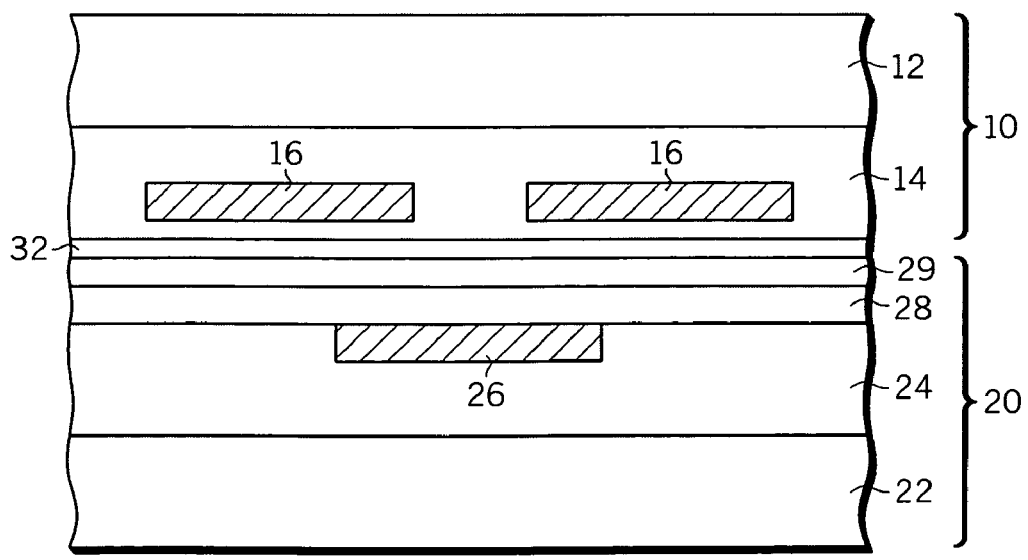
FIG. 3 is a cross section of the donor wafer bonded to the host wafer.

Referring to FIG. 3, after both the donor wafer 10 and host wafer 20 have been planarized and prepped, the donor wafer 10 in inverted, aligned to the host wafer 20, and bonded to form the bonded device 30. The bonding is accomplished using an adhesive wafer bond 32 about one micron thick. Various materials with a low dielectric constant could be used for the adhesive bond, including a bridged poly-arylene ether with a dielectric constant of 2.8 and thermal stability of up to 400° C. (Flare, which is manufactured by Honeywell Advanced Microelectronic Materials). In organic applications, an organic material Benzocyclobutene (BCB), produced by Dow Chemical, for example, may be used as the adhesive wafer bond 32.

Figure 4:
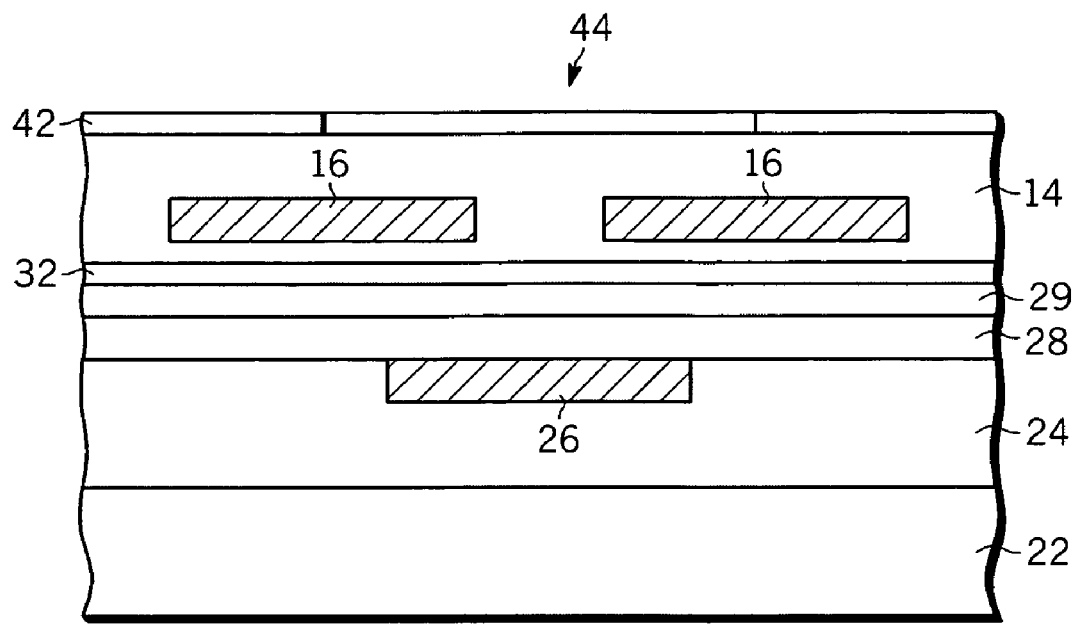
FIG. 4–6 are cross sections showing the donor wafer bonded to the host wafer being transformed and the steps of the present invention are applied thereto.

Referring to FIG. 4, the silicon substrate 12 is removed from the bonded donor and host wafers 10, 20 and a resist layer 42 is formed on the dielectric layer 14 so as to create an opening 44 in a manner known to those skilled in the art.

Figure 5:
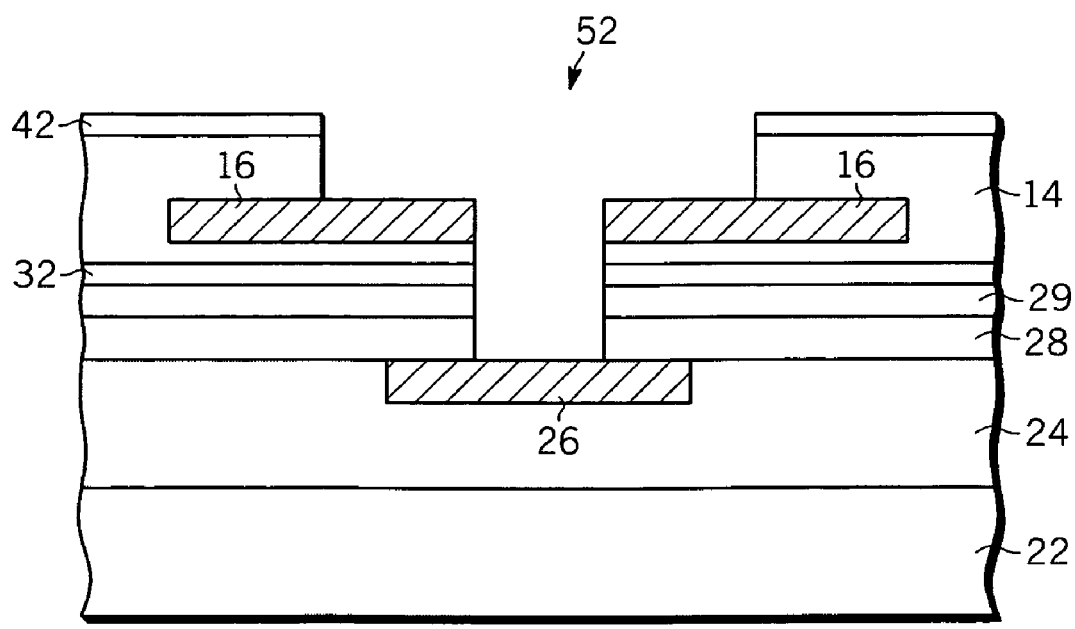

Referring to FIG. 5, the via 52 is created by first etching with any conventional etch, for example $C_4F_8/Ar$, to remove the portion of dielectric layer 14 above the adhesive layer.

Then, in accordance with the preferred embodiment of the present invention, $60CF_4/20Ar/60CHF_3/20N_2$ is used to etch through the BCB 32, the silicon oxide layer 29, and the silicon nitride layer 28, to create a via 52 that extends to metal connector 26. This etch is preferably accomplished at room temperature for about 10 minutes. This etch will effectively cut through the adhesive bonding layer 32, silicon oxide layer 24, and the silicon nitride layer 28 creating a vertical sidewall via without any undercutting of these layers or the adhesive layer 32. No undercut of the dielectrics or adhesive layer 32 during the plasma etch of the via is desired because of the requirement for coplanar sidewalls for adequate fill during subsequent metallization. Non-coplanar sidewalls would lead to voiding and poor metal step coverage into the via. The requirement for coplanar sidewalls requires that the dielectric and adhesive layer 32 must all etch at the same rate in the horizontal direction as shown in FIG. 5 to prevent undercutting. This requirement can only be achieved by using the preferred embodiment of the present invention.

Figure 6:
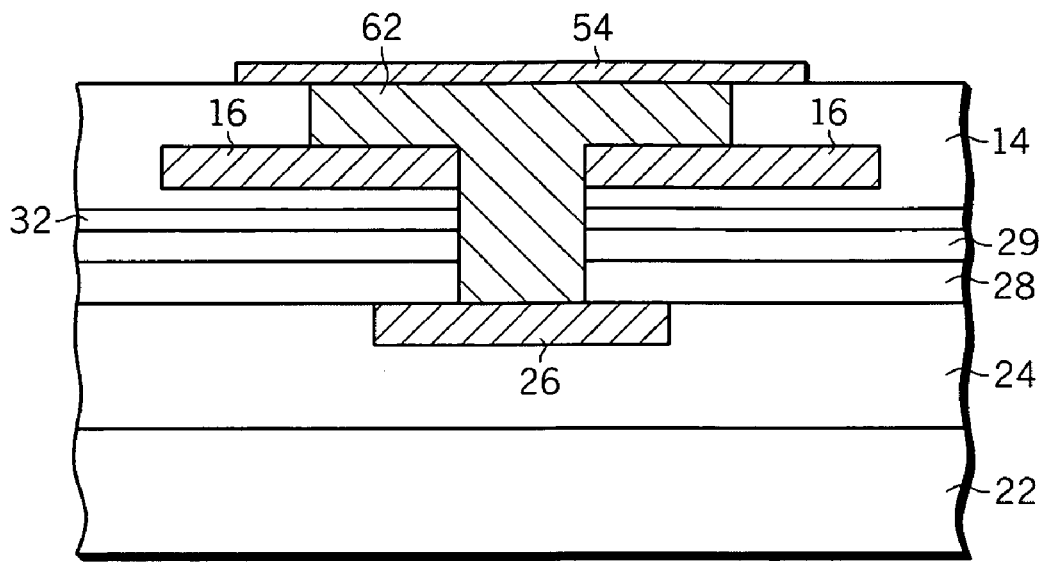

Referring to FIG. 6, the resist layer 42 (about 1000 Angstroms remains after the previous etch) is removed with anisotropic high density oxygen plasma at room temperature for approximately 5 minutes. This anisotropic stripping process requires the use of a high density source and reactive oxygen ions at low pressures as is known to those skilled in the art. Typically, since anisotropy is not required for resist stripping, conventional non-high density plasma sources, and free radical chemistry at high pressures are used to strip resist. This previously known dry stripping process, as well as wet chemical stripping, would undercut the adhesive wafer bond, while the process taught herein does not. A metal 62 is inserted into the opening 44 to fill the via 52. The metal covers the sidewalls and bottom of the etched via forming ohmic contacts to the metal connectors 16 and 26. Optionally, the via 52 may then be plugged with a plated metal, with the surface being re-planarized. A metal connector 54 may then formed on top of the via 52.

Figure 7:
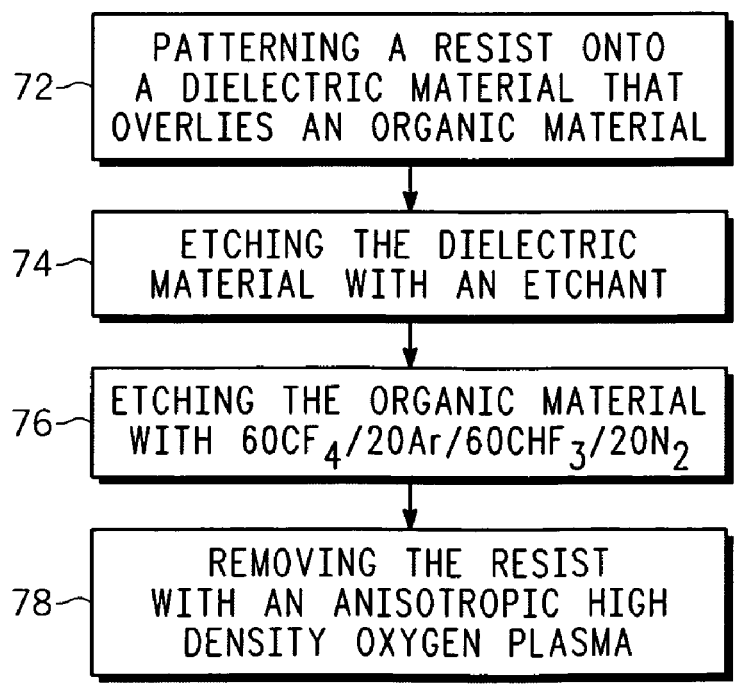
FIG. 7 is a flow chart showing the steps of the preferred embodiment of the present invention.

Referring to FIG. 7, the steps of the preferred embodiment of the present invention include patterning 72 a resist 42 onto a dielectric material 14 that overlies the organic material 32, etching 74 the dielectric material 14 with an etchant, etching 76 the organic material 32 with $60CF_4/20Ar/60CHF_3/20N_2$, and removing 78 the resist 42 with an anisotropic high density oxygen plasma.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

The invention claimed is:

1. A process for forming a via in a structure, the structure including a dielectric and an organic bonding material, comprising:
    forming a resist material on the dielectric layer;
    etching through the dielectric layer; and
    etching through the organic bonding material with an etchant consisting of $CF_4$, Ar, $CHF_3$, and $N_2$.

2. The process of claim 1 wherein the etching through the organic bonding material comprises etching with $60CF_4/20Ar/60CHF_3/20N_2$.

3. The process of claim 1 further comprising removing the resist with an anisotropic high density oxygen plasma.

4. The process of claim 1 wherein the etching through the organic bonding material comprises etching through a bridged poly-arylene ether.

5. The process of claim 1 wherein the etching through the organic bonding material comprises etching through benzocyclobutene.

6. A process for forming a via in a structure, the structure including a dielectric layer bonded to a silicon nitride layer with an organic bonding material, comprising the steps of:
    forming a resist material on the dielectric layer;
    etching through the dielectric layer; and
    etching through the organic bonding material and the silicon nitride layer with an etchant consisting of $CF_4$, Ar, $CHF_3$, and $N_2$.

7. The process of claim 6 wherein the etching through the organic bonding material comprises etching with $60CF_4/20Ar/60CHF_3/20N_2$.

8. The process of claim 6 further comprising removing the resist with an anisotropic high density oxygen plasma.

9. The process of claim 6 wherein the etching through the organic bonding material comprises etching through a bridged poly-arylene ether.

10. The process of claim 6 wherein the etching through the organic bonding material comprises etching through benzocyclobutene.

11. A process for forming a via in a structure, the structure including a first dielectric layer bonded to a silicon nitride layer overlying a second dielectric layer with an organic bonding material, the dielectric layer and the silicon layer containing first and second metal contacts, respectfully, comprising the steps of:
    forming a resist material on the first dielectric layer;
    etching through the first dielectric layer;
    etching through the organic bonding material and the silicon nitride layer with an etchant consisting of $CF_4$, Ar, $CHF_3$, and $N_2$; and
    forming a conductive material within the via, the conductive material contacting the first and second metal contacts.

12. The process of claim 11 wherein the etching through the organic bonding material comprises etching with $60CF_4/20Ar/60CHF_3/20N_2$.

13. The process of claim 11 further comprising removing the resist with an anisotropic high density oxygen plasma.

14. The process of claim 11 wherein etching through the organic bonding material comprises etching through a bridged poly-arylene ether.

15. The process of claim 11 wherein the etching through the organic bonding material comprises etching through benzocyclobutene.

16. A process comprising:
    bonding a donor wafer to a host wafer with an organic material, the donor wafer comprising a first dielectric layer and a first metal contact, the host wafer comprising a second dielectric layer overlying a substrate with a second metal contact contained within the dielectric material and a silicon nitride layer overlying the second dielectric layer and second metal layer;

forming a resist material on the first dielectric layer;
etching through the first dielectric layer;
etching through the organic bonding material and the second dielectric layer with an etchant consisting of $CF_4$, Ar, $CHF_3$, and $N_2$; and
forming a conductive material within the via that contacts the first and second metal contacts.

17. The process of claim 16 wherein the etching through the organic bonding material comprises etching with $60CF_4/20Ar/60CHF_3/20N_2$.

18. The process of claim 16 further comprising removing the resist with an anisotropic high density oxygen plasma.

19. The process of claim 16 wherein etching through the organic bonding material comprises etching through a bridged poly-arylene ether.

20. The process of claim 16 wherein the etching through the organic bonding material comprises etching through benzocyclobutene.

* * * * *